US012644692B2

(12) United States Patent
Demarest

(10) Patent No.: US 12,644,692 B2
(45) Date of Patent: Jun. 2, 2026

(54) DATA AGE REDUCTION

(71) Applicant: Zygo Corporation, Middlefield, CT (US)

(72) Inventor: Frank C. Demarest, Pomfret Center, CT (US)

(73) Assignee: Zygo Corporation, Middlefield, CT (US)

( * ) Notice: Subject to any disclaimer, the term of this patent is extended or adjusted under 35 U.S.C. 154(b) by 544 days.

(21) Appl. No.: 18/143,098

(22) Filed: May 4, 2023

(65) Prior Publication Data

US 2023/0366670 A1 Nov. 16, 2023

Related U.S. Application Data

(60) Provisional application No. 63/340,025, filed on May 10, 2022.

(51) Int. Cl.
*G01B 9/02055* (2022.01)
*G03F 7/00* (2006.01)

(52) U.S. Cl.
CPC ..... *G01B 9/02077* (2013.01); *G01B 9/02068* (2013.01); *G03F 7/70775* (2013.01)

(58) Field of Classification Search
CPC ............ G01B 9/02077; G01B 9/02068; G01B 9/02003; G01B 9/02018; G01B 9/0207; G01B 9/02075; G01B 9/02083; G01D 3/02; G01D 5/24495; G01D 5/266; G01P 3/68; G01P 15/093; G03F 7/70775
See application file for complete search history.

(56) References Cited

U.S. PATENT DOCUMENTS

| | | | |
|---|---|---|---|
| 4,688,940 A | 8/1987 | Sommargren et al. | |
| 4,859,066 A | 8/1989 | Sommargren | |
| 5,767,972 A | 6/1998 | Demarest | |
| 6,597,459 B2 | 7/2003 | Demarest | |
| 6,757,066 B2 | 6/2004 | Hill | |
| 6,975,406 B2 | 12/2005 | Demarest | |
| 7,542,147 B2 | 6/2009 | Demarest | |

(Continued)

FOREIGN PATENT DOCUMENTS

TW 202001285 1/2020

OTHER PUBLICATIONS

Benedict, et al., "Synthesis of an Optimal Set of Radar Track-While-Scan Smoothing Equations," *IRE Transactions on Automatic Control*, pp. 27-32, New York, NY (Jul. 1962).

(Continued)

*Primary Examiner* — Keith D Bloomquist
(74) *Attorney, Agent, or Firm* — Fish & Richardson P.C.

(57) ABSTRACT

Disclosed are method and electronic components for: i) electronically extracting a sequence of values from a measurement signal corresponding to a position of a moving object, wherein the sequence of values indicates the position of the moving object at corresponding time increments; ii) electronically determining at least one of an estimate for a velocity of the moving object and an estimate for an acceleration of the moving the object based on a plurality of the values in the sequence of values; and iii) electronically correcting a value in the sequence of values to substantially reduce the effect of processing and signal delays based on one or both of the velocity and acceleration estimates.

34 Claims, 8 Drawing Sheets

(56) References Cited

U.S. PATENT DOCUMENTS

| | | | | |
|---|---|---|---|---|
| 7,636,165 | B2 | 12/2009 | Klaver et al. | |
| 8,300,233 | B2 | 10/2012 | Deck et al. | |
| 2002/0021449 | A1* | 2/2002 | Demarest | G01B 9/02083 |
| | | | | 356/498 |
| 2003/0025914 | A1* | 2/2003 | Demarest | G01B 9/02083 |
| | | | | 356/500 |
| 2008/0109178 | A1* | 5/2008 | Sogard | G03F 7/70775 |
| | | | | 702/66 |
| 2010/0303460 | A1* | 12/2010 | Hunter | G01D 5/24419 |
| | | | | 398/25 |
| 2016/0202089 | A1* | 7/2016 | Leoncavallo | G01D 5/24476 |
| | | | | 324/207.12 |
| 2017/0131119 | A1 | 5/2017 | Riedmueller et al. | |
| 2019/0383907 | A1 | 12/2019 | Belsley et al. | |
| 2021/0109158 | A1* | 4/2021 | Manson | G01R 31/343 |

OTHER PUBLICATIONS

Demarest, "High resolution, high-speed, low data age uncertainty, heterodyne displacement measuring interferometer electronics", *Meas. Sci. Technol.*, vol. 9, pp. 1024-1030 (1998).

Gray et al., "A Derivation of an Analytic Expression for the Tracking Index for the Alpha-Beta-Gamma Filter", *IEEE Transactions on Aerospace and Electronic Systems*, vol. 29, No. 3, pp. 1064-1065 (Jul. 1993).

Kalata, "The Tracking Index: A Generalized Parameter for $\alpha$-$\beta$ and $\alpha$-$\beta$-$\gamma$ Target Trackers" *IEEE Transactions on Aerospace and Electronic Systems*, vol. AES-20, No. 2 pp. 174-182, (Mar. 1984).

Lyons, "A Differentiator with a Difference", (2007) at https://www.dsprelated.com/showarticle/35.php.

Lyons, "A New Contender in the Digital Differentiator Race", (2015) at https://www.dsprelated.com/showarticle/814.php.

Penoyer, "The Alpha-Beta Filter", *The C Users Journal*, pp. 73-86 (Jul. 1993).

Tenne et al., "Characterizing Performance of $\alpha$-$\beta$-$\gamma$ Filters", *IEEE Transactions on Aerospace and Electronic Systems*, vol. 38, No. 3, pp. 1072-1087 (Jul. 2002).

The Office Action and Search Report issued by the Taiwan Patent Office for Application No. TW 112116529, dated Jun. 4, 2024 (with English Translation).

The International Search Report and Written Opinion of the International Searching Authority for International Application No. PCT/US2023/020934, dated Jul. 26, 2023.

* cited by examiner

DATA AGE REDUCTION

CROSS-REFERENCE TO RELATED APPLICATION

This application claims priority to U.S. provisional patent application 63/340,025, filed on May 10, 2022, the entire content of which is incorporated herein by reference.

TECHNICAL FIELD

This disclosure relates to methods and systems for reducing errors arising from relative differences in data age among measuring systems and positioning systems relying on such measuring systems, such as encoder and/or interferometric optical systems.

BACKGROUND

All signal propagation and processing has some inherent and unavoidable delay which may be called latency, group delay, or data age. In some applications this delay makes the desired system performance difficult or impossible to achieve absent correction. For example, in certain application a processed measurements signal from a metrology system used to monitor the position of a movable object may be delayed because of such data age. This can be especially problematic if that measurement signal is used, at least in part, to trigger or control the actions of one or more other components that are expected to be synchronized in time with the position of the moving object. One such example is where optical interferometric and/or encoder systems are used to monitor the position of an object (e.g., a semiconductor wafer) on a movable stage to trigger selective exposure (e.g., by an optical, electron, or ion beam) of certain locations of the object. Specifically, if the measured location of the object is delayed in time, absent correction, incorrect locations will be exposed.

SUMMARY

For a measurement system that requires near-zero data age, data age reduction ("DAR") during the constant velocity ("CV") region can be corrected relatively easily by adjusting the position value (distance) by an amount equal to the product of the known constant velocity and the known constant data age (distance=velocity*time) or other simple methods. DAR during the acceleration or deceleration ("AD"), however, is more complicated, for at least the reasons that: (1) the velocity is changing during the acceleration, (2) the acceleration is changing during the "jerk" interval (i.e. changes in acceleration), and (3) the alpha-beta filter typically used in these systems to reduce noise also introduces a position error proportional to acceleration. The present disclosure relates to methods and systems for reducing DAR during AD.

In general, in one aspect, disclosed is a method including: i) electronically extracting a sequence of values from a measurement signal corresponding to a position of a moving object, wherein the sequence of values indicates the position of the moving object at corresponding time increments; ii) electronically determining at least one of an estimate for a velocity of the moving object and an estimate for an acceleration of the moving the object based on a plurality of the values in the sequence of values; and iii) electronically correcting a subsequent value in the sequence of values based on one or both of the velocity and acceleration estimates.

In general, in another aspect, disclosed is an apparatus including an electronic processing module implementing one or more processors and configured to: i) electronically extract a sequence of values from a measurement signal corresponding to a position of a moving object, wherein the sequence of values indicates the position of the moving object at corresponding time increments; ii) electronically determine at least one of an estimate for a velocity of the moving object and an estimate for an acceleration of the moving the object based on a plurality of the values in the sequence of values; and iii) electronically correct a subsequent value in the sequence of values based on one or both of the velocity and acceleration estimates.

Embodiments of the method and apparatus may include any of the following features.

The velocity estimate may be electronically determined and used to correct the subsequent value in the sequence of values to correct for a position error caused by a data age delay. For example, the data age delay is greater than 100 ns. Also, for example, the data age delay includes data age delay caused by the electronic extraction of the sequence of values.

The acceleration estimate may be electronically determined and used to correct the subsequent value in the sequence of values. For example, the method may further include electronically filtering the sequence of values to reduce noise using a digital filter, for example, by using an alpha-beta filter, and the acceleration estimate is used to correct a position error in the subsequent value caused by an acceleration-dependent error from the electronic filtering. The electronic filtering may be implemented before or after the electronic correction of the subsequent value.

Furthermore, in some embodiments, both of the velocity estimate and the acceleration estimate are electronically determined and used to adjust the subsequent value in the sequence of values to reduce a position error caused by a data age delay in the electronic extraction of the sequence of values and/or a position error caused by acceleration-dependent electronic filtering errors.

The method may further include repeating the electronic determining and the electronic correcting to provide a sequence of corrected values indicating the position of the moving object at corresponding time increments that is corrected for position errors caused by data age delay in the electronic extraction of the sequence of values and/or acceleration-dependent electronic filtering errors. Furthermore, the method may further include applying an action to the moving object based on the sequence of corrected values. For example, the action may include directing an energy beam to a certain location of the object and/or photographing or otherwise optically inspecting the moving object. For example, the object may be supported by a moving stage and a measurement system is optically coupled to the moving stage to generate the measurement signal. For example, the measurement system may include an interferometry system and/or an encoder system. Similarly, the apparatus may include any of the electronics, the beam energy system, the moving stage, and the measurement system for implementing such methods.

The time increments may be in the range of 10 ns to 1 μs, or more narrowly, in the range of 25 ns to 100 ns.

The absolute velocity of the object may exceed 0.001 m/s during at least a portion of the time corresponding to the sequence of values and may be less than 100 m/s during all of the time corresponding to the sequence of values, or more narrowly, the absolute velocity of the object may exceed 0.001 m/s during at least a portion of the time corresponding to the sequence of values and may be less than 10 m/s during all of the time corresponding to the sequence of values.

The absolute acceleration of the object may exceed 1 m/s$^2$ during at least a portion of the time corresponding to the sequence of values and may be less than 100 m/s$^2$ during all of the time corresponding to the sequence of values.

The electronically determining at least one of an estimate for a velocity of the moving object and an estimate for an acceleration of the moving the object based on a plurality of the values in the sequence of values may include electronically applying one or more differencing operations to the plurality of values. For example, the velocity estimate $V_n$ for the n$^{th}$ time increment is determined according to:

$$V_n = \frac{P_n - P_{n-dnv}}{dnv}$$

where $P_n$ is the value in the sequence of values indicating position at time increment n and dnv is a positive integer. The acceleration estimate $A_n$ for the n$^{th}$ time increment may be determined according to:

$$A_n = \frac{V_n - V_{n-dna}}{dna}$$

where dna is a positive integer. In certain embodiments, dnv=dna. The corrected position value $Pdar_n$ in the sequence of values indicating position at time increment n may then be determined according to:

$$Pdar_n = P_n + Rv \cdot V_n + Ra \cdot A_n$$

wherein $P_n$ is the value in the sequence of values indicating position at time increment n, wherein $V_n$ and $A_n$ are the velocity and acceleration estimates at time increment n, respectively, and wherein Rv and Ra are constants. Embodiments may further include determining the constants Rv and Ra in simulation or with hardware-generated internal test signals.

All documents referred to herein, if any, are incorporated by reference in their entirety. In case of conflict with the present disclosure, and any document incorporated by reference, the present disclosure controls.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
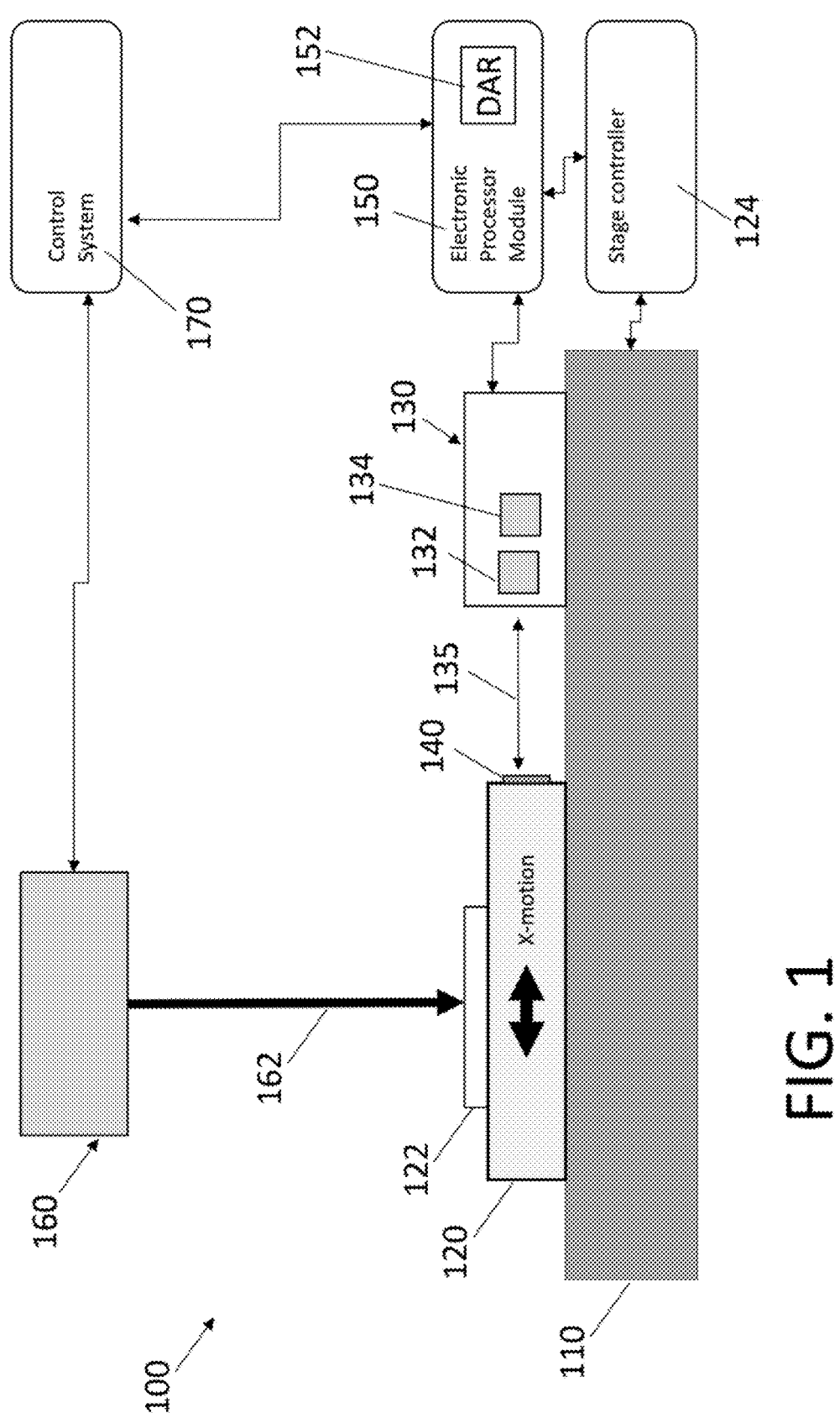
FIG. 1 is a schematic diagram of a stage metrology system.

FIG. 1 is a schematic diagram of a stage metrology system 100 including a reference frame 110 supporting a movable stage 120 configured to hold an object 122 such as a semiconductor wafer. A stage controller 124 drives motors (not shown) to selectively move stage 120 along reference frame 110. For simplicity, movement along reference frame 110 is depicted along only one dimension (e.g., the X-direction), but movement along the Y-direction (orthogonal to X-direction and into the page of FIG. 1) is also possible and well known in the art (as is positioning along the height (i.e., Z-direction) and rotations). For precision monitoring of the position of object 120 along frame 110, opto-electronic metrology systems, such as interferometric and/or encoder systems, are common. For example, metrology system 100 includes an interferometric optical module 130 supported by frame 110, which directs an optical beam 135 from a laser light source 132 in module 130 to a stage mirror 140 mounted on stage 120. The stage mirror 140 reflects optical beam 135 back to the interferometric optical module, which combines the reflected beam with an internal reference beam to produce optical interference signal including phase information that can be electronically detected by detector 134 in module 130 to ultimately produce an electronic phase signal indicative of a distance traveled by the stage 120. For example, for a Helium Neon laser light source operating at λ=633 nm and a simple single pass arrangement as shown in FIG. 1, a measurement of a full 2pi phase cycle corresponds a distance travelled of λ/2=316.5 nm, and for common double pass arrangements, a measurement of a full 2pi phase cycle corresponds a distance travelled of λ/4=158.25 nm. Such interferometry systems, including for monitoring multiple degrees of freedom are well known in the art; see, for example, any of U.S. Pat. Nos. 4,688,940, 4,859,066, and 6,757,066. Furthermore, in other embodiments, the interferometric optical module can be carried by the stage 120 and the reflecting mirror supported by reference frame 110. Also, in further embodiments, the interferometric optical module is at a distance from the stage and optical fiber is used to assist in coupling the beam from the module to the moving stage and back again. Furthermore, in some embodiments, the light recombined in the interferometric optical module can be fiber-coupled to a remote detector in the electronic processing module. In yet further embodiments, the interferometric optical module 130 and stage mirror 140 are replaced with an optical encoder system and reflective and/or diffractive encoder elements, respectively, as is also well known in the art; see, for example, any of U.S. Pat. Nos.

7,636,165 and 8,300,233. System 100 further includes an electronic processor module 150 electronically coupled with the detector 134 in interferometric optical module 130 for processing the detected signal and generating a position signal P(t) for stage controller 124 indicating the position P of the stage along the X-axis a time t.

In many applications, the stage metrology system is used to coordinate specific actions on the object 122 supported by stage 120. For example, one common application is selective exposure of certain locations of object 122 by an energy beam 162 from a beam exposure system 160. For example, the energy beam can be an optical beam, an electron beam, or an ion beam. This application is common for location-specific inspection and/or processing of the object. Accordingly, system 100 further includes a control system 170 coupled to electronic processor module 150, stage controller 124, and beam exposure system 160 to coordinate the actions of beam exposure system with the correct location of object 122 supported by moving stage 120. However, such coordination can be compromised by data age in the position signal generated by electronic processing module 150. For example, rather than actually providing the position P of the object at the present time t, absent correction, the processing module may provide a position signal $P(t-t_0)$ corresponding to a slightly earlier time corresponding to a data age $t_0$. Source of such data age can include constant delays of optical, analog, and digital signals; delays due to changing optical path lengths; frequency-dependent group delay caused by analog electronics; and biasing-dependent effects from photodetectors (e.g., avalanche photodiodes).

Moreover, and of particular interest here, is the exacerbation of any of these data age effects for accelerating objects, thereby creating velocity-dependent position errors due to the date age, as well as position errors resulting from acceleration-dependent offsets from digital filters otherwise used to reduce noise. By way of example, the methods disclosed herein may be especially applicable for stage systems in which the absolute velocity of the moving object exceeds 0.001 m/s during at least a portion of the time corresponding to the sequence of values and is less than 100 m/s (or more preferably less than 10 m/s) during all of the time corresponding to the sequence of values. Similarly, by way of example, the methods disclosed herein may be especially applicable for stage systems in which the absolute acceleration of the object exceeds 0.1 m/s² (or more preferably exceeds 0.5 m/s²) during at least a portion of the time corresponding to the sequence of values and is less than 100 m/s² (or more preferably less than 10 m/s²) during all of the time corresponding to the sequence of values. As will be described in further detail below, the electronic processing module 150 includes DAR correction electronics 152 to reduce positions errors causes by data age, which in turn improves the coordination of the stage movement by stage 120 with actions directed to object 122 carried by the moving stage, such as those by beam exposure system 160.

Figure 2A:
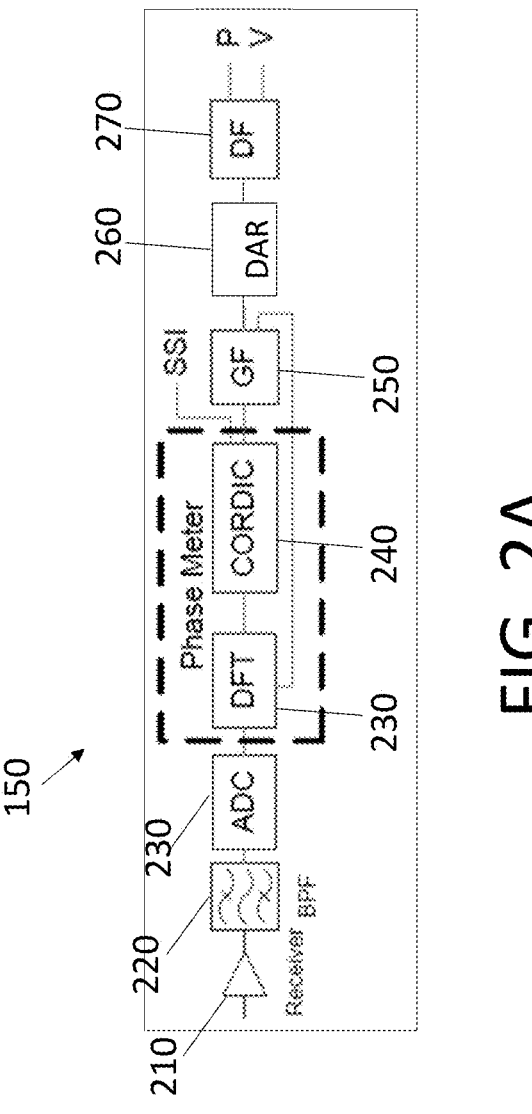
FIGS. 2A and 2B are schematic block diagrams of exemplary components for two embodiments, respectively, of an electronic processing module for processing optical signals indicative of a stage position.
Figure 2B:
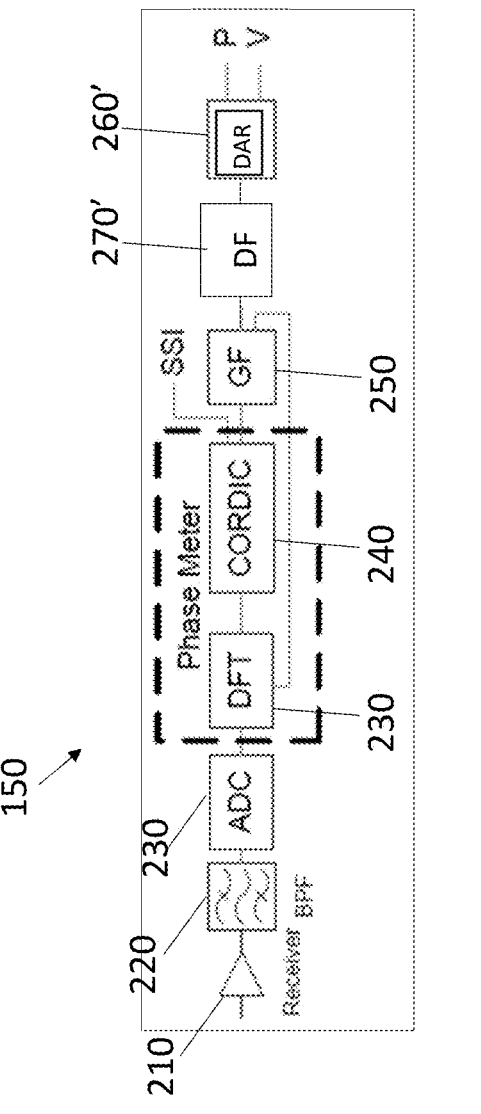

FIG. 2A is a schematic block diagram of exemplary components for electronic processing module 150. For example, module 150 includes a photodetector receiver 210 for receiving the optical beam from the stage (e.g., via an optical fiber) and outputting an analog signal indicative of the beam's time-dependent intensity, a band pass filter ("BPF") 220 to substantially reduce signal frequencies that may be aliased and affect the measurement. An exemplary system with a signal frequency range of 4 to 36 MHz may have a BPF passband of 100 kHz to 37 MHz. Analog-to-digital converter ("ADC") 230 samples the analog signal and outputs a series of digital values representing the instantaneous value of the intensity signal. The module further includes a phase meter formed by a discrete Fourier transform ("DFT") module 230 that selects the signal frequency of interest and outputs a series of complex values representing the signal and nearby frequencies and a coordinate rotation by digital computer ("CORDIC") module 240 that converts the complex values (i.e. rectangular coordinates) from the DFT into magnitude and phase (i.e. polar coordinates). The magnitude value may be used as a signal strength indicator (SSI). The module then includes a glitch filter ("GF") 250 (also known as the position calculator), which "connects" or "unwraps" phase discontinuities to produce position values, a data age reduction ("DAR") module 260, which substantially reduces the data age (i.e. processing delay), and finally a digital filter ("DF") 270, which reduces noise on the position values. As shown in FIG. 2A, the output of processing module 150 are sequences of position P and velocity V values for the moving stage. But for DAR module 260, which is described in greater detail below, these components are known in the art. See, for example, U.S. Pat. Nos. 5,767,972, 6,975,406, 6,597,459, and 7,542,147 describing similar architecture, including the glitch filter GF. In preferred embodiments, the digital filter DF implements "alpha-beta" filters or "alpha-beta-gamma" filters, well-known in the art; see, e.g., Benedict, T. R. and G. W. Bordner, "Synthesis of an Optimal Set of Radar Track-While-Scan Smoothing Equations," IRE Transactions on Automatic Control, pp. 27-32, New York, NY (July 1962); Robert Penoyer, "The Alpha-Beta Filter" in The C Users Journal (July 1993) pp. 73-86; Paul R. Kalata, "The Tracking Index: A Generalized Parameter for $\alpha$-$\beta$ and $\alpha$-$\beta$-$\gamma$ Target Trackers" in IEEE Transactions on Aerospace and Electronic Systems, Vol. AES-20 (March 1984), pp. 174-182; J. F. Gray and W. Murray, "A Derivation of an Analytic Expression for the Tracking Index for the Alpha-Beta-Gamma Filter" in in IEEE Transactions on Aerospace and Electronic Systems, Vol. 29 (July 1993), pp. 1064-1065; D. Tenne and T. Singh, "Characterizing Performance of $\alpha$-$\beta$-$\gamma$ Filters" in IEEE Transactions on Aerospace and Electronic Systems, Vol. 38 (July 2002), pp. 1072-1087. Also, in further embodiments, the DAR module 260' can be applied after digital filter 270' as shown in FIG. 2B, rather than before as shown in FIG. 2A.

Figure 3:
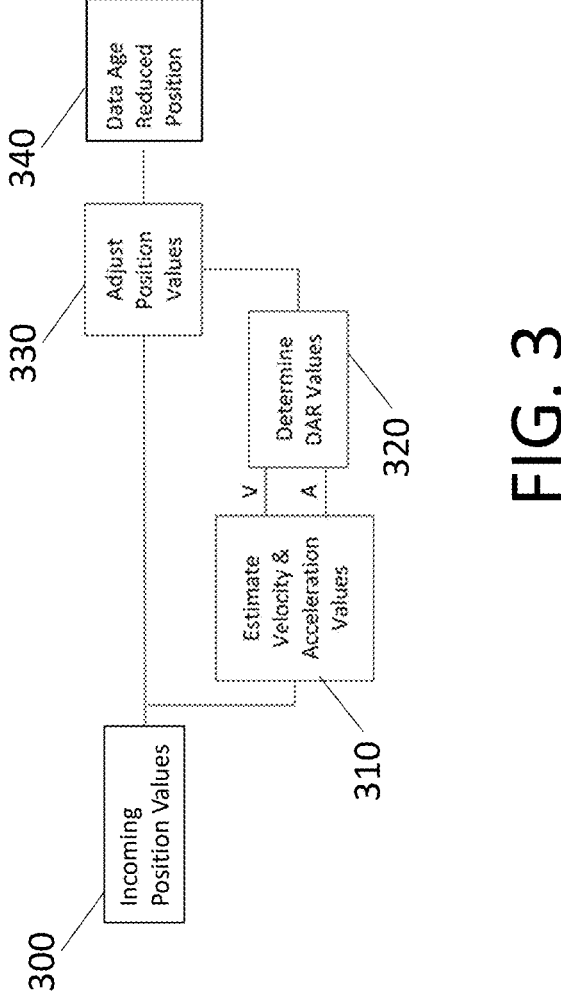
FIG. 3 is a schematic diagram of the processing provided by a data age reduction module in an electronic processing module for processing signals indicative of a stage position.

FIG. 3 is a schematic diagram of the processing provided by DAR module 260. Incoming position values P in block 300 are processed in block 310 to produce estimates of values for velocity V and acceleration A. The velocity estimation can be done by processing the calculated position value with a first difference calculation having a delay between inputs of a given number of samples, for example 1000 samples (100 µs at 10 MS/s). Any suitable velocity estimation method can be used, for example processing the position value with a digital differentiator; and may include a digital filter to reduce noise. The acceleration estimation can be done by processing the velocity estimate with a first difference calculation having a delay between inputs of a given number of samples, for example the same delay as the velocity estimate (i.e., giving results equivalent to a second difference). Any suitable acceleration estimation method can be used which could include processing the position value or velocity estimate with a digital differentiator; and may include a digital filter to reduce noise. The resulting velocity V and acceleration A values are then combined in block 320 with predetermined DAR correction coefficients $R_v$ and $R_a$ to determine an overall DAR correction. In block 330, the DAR compensation is used to adjust the incoming position values P to provide output position values Pdar that are corrected to reduce data age errors (block 340). Additional details are provided below.

In general, the position values P provided by GF module 250 to DAR module 260 correspond to a sequence of positions values P for a sequence of time intervals, $t_1$, $t_2$, $t_3$, etc. As noted above, however, because of data age, those position values may correspond to earlier time, with a delay corresponding to a data age, so that the actual positions values correspond to $P(t_1-t_{o1})$, $P(t_2-t_{o2})$, $P(t_3-t_{o3})$, ... rather than $P(t_1)$, $P(t_2)$, $P(t_3)$ ..., respectively. The purpose of the DAR module 260 is to correct for this mismatch (and to further compensate for any subsequent errors introduced by DF module 270). In general, the data age compensation is directed at reducing or eliminating the delay of the signal through everything from the interferometer to where the position value is available to the user. Often, a dominant source of the delay is delay caused during the electronic extraction of the position values, which can be greater than 100 ns. Moreover, when the object is moving, such delays cause position errors approximately corresponding to the product of the object velocity and the data age.

The clock that samples the incoming data with the ADC (and lower frequency clocks in any field programmable gate array ("FPGA")) are all very low jitter (<1 ps), so that from a signal processing view-point, one can assume that the time increments are evenly spaced, i.e., $t_n=n\cdot\Delta T$, where $\Delta T$ is the sampling period, which typically corresponds to a value in the range of about 10 nanoseconds ("ns") at the ADC to about 100 ns or more further downstream at the DAR processing. Moreover, the actual data age for a given system for many embodiments is stable and constant, with the exception of the following: 1) Phase shift and group delay variations vs frequency in the analog electronics; and 2) acceleration dependent offsets caused by the DF module 270. The first error can be compensated earlier in the data path as taught in U.S. Pat. No. 7,542,147 and is generally only applicable to certain types of detectors, and is not considered in the compensation scheme below. The second error is proactively compensated by DAR module 260 as explained below. Accordingly, the sequence of position values $P(t_1-t_{o1})$, $P(t_2-t_{o2})$, $P(t_3-t_{o3})$, ... incoming to the DAR module 260 can generally be expressed as $P_n=P(n\cdot\Delta T-T_0)$, where $T_0$ is the data age error. For example, in many applications relevant here, the data age error $T_0$ is greater than 100 ns, at least in part due to data age delay caused by the electronic extraction by electronics such as those depicted in FIG. 2A.

The velocity estimate, acceleration estimate, and data age reduced position values for an exemplary implementation may be described mathematically as follows. To estimate values for velocity $V_n$ and acceleration $A_n$, block 310 in the DAR module 260 processes the incoming position values $P_n$ as follows, where n is index for the time-sequence of values:

$$V_n = \frac{P_n - P_{n-dnv}}{dnv} \tag{1}$$

$$A_n = \frac{V_n - V_{n-dna}}{dna} \tag{2}$$

where dnv and dna are integer values for the differencing operation for the velocity and acceleration estimates, respectively.

These values for velocity $V_n$ and acceleration $A_n$ are sent to block 320 in the DAR module 260, which stores DAR correction coefficients $R_v$ and $R_a$ for velocity and acceleration, respectively, and calculates a DAR correction for position Pcor as follows:

$$Pcor_n = Rv \cdot V_n + Ra \cdot A_n \tag{3}$$

The units of Rv are the sampling period $\Delta T$, and the units of Ra are $(\Delta T)^2$. The actual scalings of Rv and Ra may be implicitly defined by the time units of velocity and acceleration respectively. These values for the DAR position correction are sent to block 330 in the DAR module 260 and processed with the incoming position values $P_n$ to produce the DAR-corrected position values Pdar as follows:

$$Pdar_n = P_n + Pcor_n \tag{4}$$

The chosen values for dnv and dna are a compromise between speed of response (smaller value) and noise reduction (larger value). For example, for higher acceleration, the delay in the velocity estimation may introduce a small error term that may be reduced by using a more elaborate (see, e.g., "A Differentiator with a Difference" by Rick Lyons (2007) at www.dsprelated.com/showarticle/35.php and "A New Contender in the Digital Differentiator Race" by Rick Lyons (2015) at www.dsprelated.com/showarticle/814.php) or faster (i.e., smaller dnv and dna values) derivative calculations. In certain embodiments, each of dnv and dna is in the range of about 10 to 10,000, or preferably, in the range between 500 and 2000, such as 100. To simplify the delay implementation and calculations, these values may preferably be a power of two. In certain embodiments, dnv and dna are set equal to one another; however, this is not necessary. The two DAR correction coefficients Ry and Ra may be determined and validated in simulation or with hardware-generated internal test signals. An exemplary simulation may include simulated position with specified velocity, acceleration, and jerk for a series of time intervals similar to the example of FIG. 4. The difference between the simulated ideal (noiseless) position and the calculated position (based on simulated position which may include measurement noise, quantization noise, expected processing delay, and DAR) may be used to evaluate performance.

Testing the implemented hardware in an actual system to determine the best values for $R_v$ and $R_a$ may be difficult and time-consuming. An exemplary self-test may include a simulated signal source (based on a simulated ideal position as described above), which may be added to actual receiver noise, to evaluate performance in a manner similar to the simulation described above.

In addition to compensating for position errors caused by the product of data age and time-dependent velocity, this method also compensates for position offsets introduced by an acceleration dependence of digital filters (e.g., alpha-beta and alpha-beta-gamma filters) used to reduce noise in the sequence of position values. The following error of a filter depends on the type of filter. A single-pole conventional lowpass filter settles to zero error for a constant position but has a following error proportional to velocity. An alpha-beta filter settles to zero error for a constant velocity but has a following error proportional to acceleration. An alpha-beta-gamma filter settles to zero error for a constant acceleration but has a following error proportional to jerk. Referring again to FIG. 2A, this acceleration-dependent offset due to the digital filter module 270 is cancelled by the acceleration-dependent correction provided by DAR module 260 as set forth, e.g., in Equations 1-3. In many applications, this compensation is small relative to the position changes due to the instantaneous velocity, and therefore in certain embodiments, the DAR compensation is performed before the digital filter so that the digital filter also reduces any quantization noise caused by the DAR compensation math. Accordingly, in such embodiments, the resulting output from the DAR module 260 is "pre-distorted" to compensate for the acceleration-dependent error subsequently introduced by the digital filter module 270. However, in other embodiments, the operating positions can be reversed as shown FIG. 2B for DAR module 260' and digital filter module 270'. Otherwise the operation is similar to that described above.

The following simulation exemplify the methods and systems above.

Figure 4:
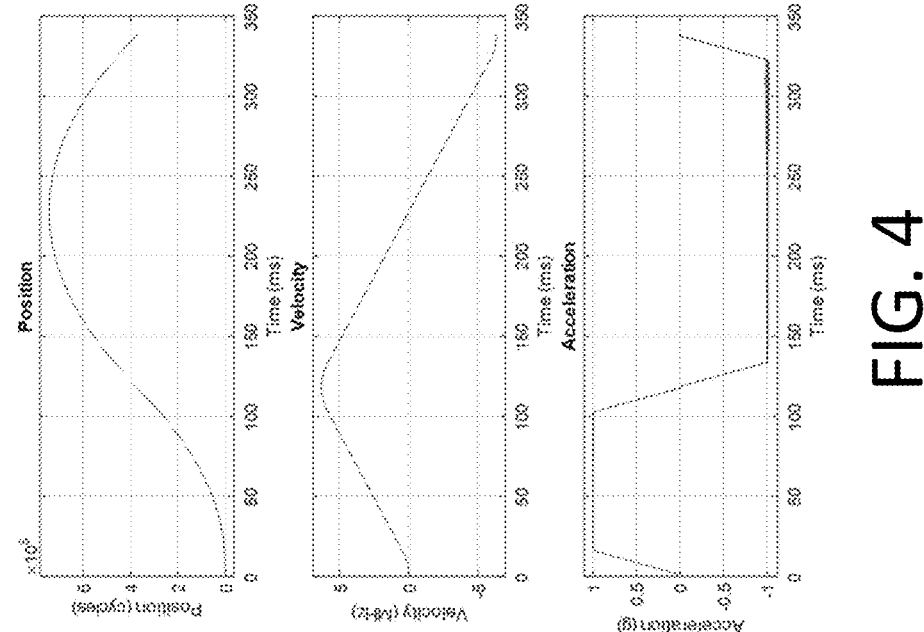
FIG. 4 is a set of graphs showing position, velocity, and acceleration of a stage in simulated example for implementing data age reduction disclosed herein.

The simulations assumed a double-pass (p=2) heterodyne interferometric measuring system based on a Helium Neon laser operating at $\lambda$=633 nm, resulting in a $2\pi$ phase measurement corresponding to a distance of 158 nm, which was quantized into 10 bits (1024 quanta), so that the least significant bit ("LSB") corresponds to a distance of 0.154 nm. The position sampling rate was 10 MHz (i.e., $\Delta T$=100 ns) and the differencing was given by: dnv=dna=1000. The simulated stage movement is set forth in FIG. 4 showing a set of the three graphs showing the position, velocity, and acceleration of simulated motion, respectively. The stage movement has ±1 g (where 1 g=9.8 m/s$^2$) acceleration/deceleration, 1 m/s constant velocity, and 15 ms jerk reduction regions. The constant velocity regions are only 1 millisecond ("ms") to reduce simulation time. The position is expressed in terms of the number of $2\pi$ phase cycles (1 cycle=158 nm). The velocity v is expressed in terms of the frequency (in MHz) of the related Doppler frequency $F_D$ corresponding to the heterodyne interferometry measurement (i.e., $F_D$=2pv/$\lambda$) so that 1 MHz corresponds to about 0.16 m/s. The data age error To in the simulation was 1 microsecond.

Figure 5:
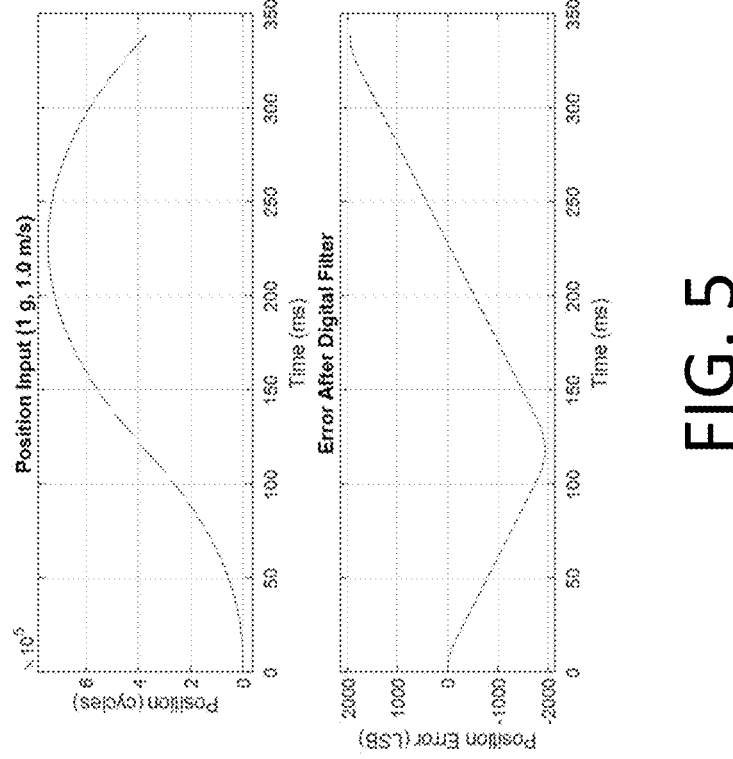
FIG. 5 is a set of graphs showing the position of the stage for the simulation (upper graph) and the corresponding filtered position errors (lower graph) caused by data age in the absence of any data age reduction.
Figure 6:
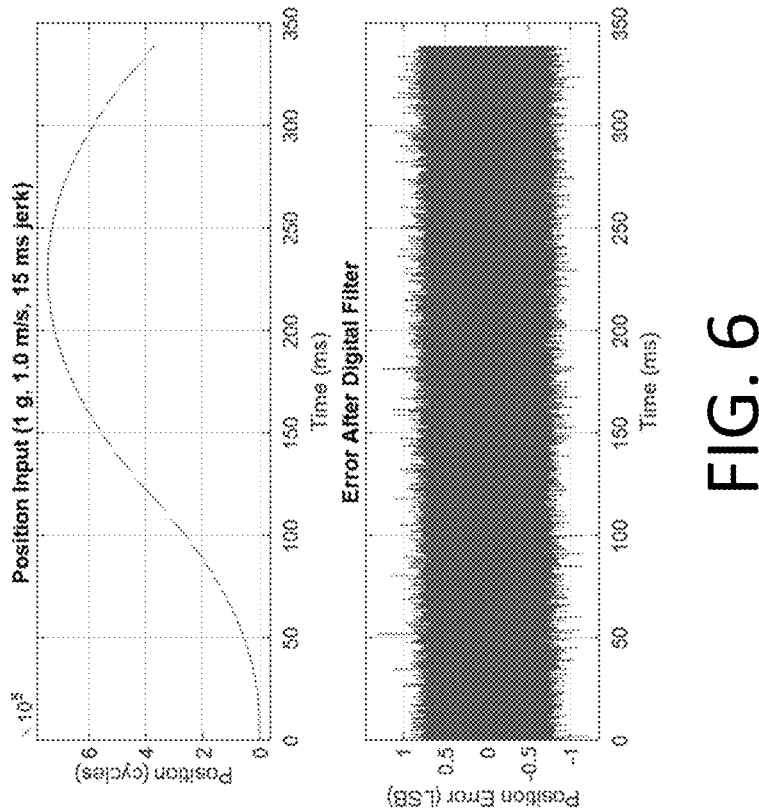
FIG. 6 is a set of graphs showing the position of the stage for the simulation (upper graph) and the corresponding residual filtered position errors (lower graph) with the data age reduction disclosed herein.
Figure 7:
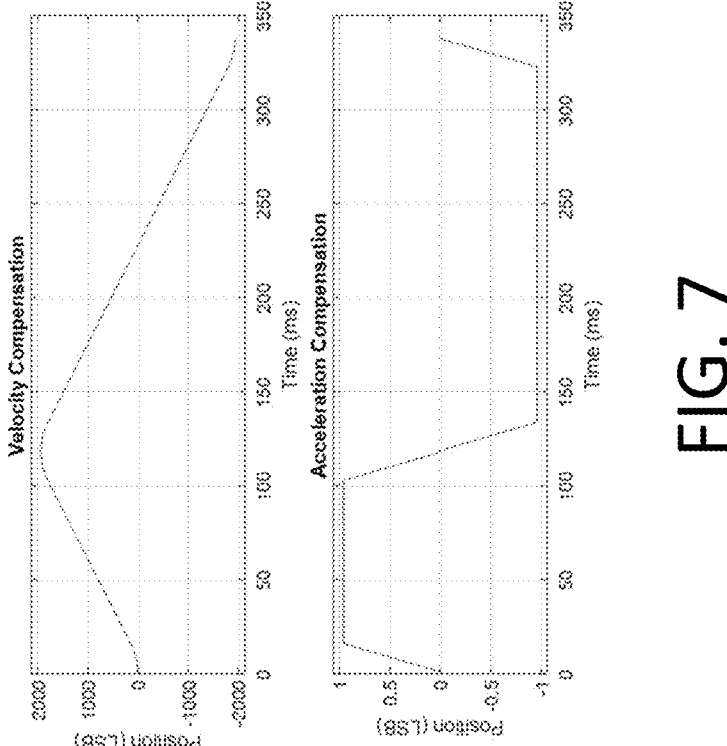
FIG. 7 is a set of graphs showing the velocity and acceleration components of the data age correction implemented for the simulation of FIG. 4 to produce the greatly reduced position error shown in the lower graph of FIG. 6.

FIG. 5 shows a set of two graphs with the upper graph again showing the position of the stage for the simulation and the lower graph showing the corresponding position error for this simulated stage motion following the implementation of the digital filter, but without any DAR correction for the 1 μs data age. The position error is shown in terms of LSB (where 1 LSB=0.154 nm). FIG. 6 shows a set of two graphs with the upper graph again showing the position of the stage for the simulation and lower graph showing the corresponding residual position error following the implementation of the DAR correction. The simulated noise source is 0.200 LSB root mean squared ("RMS"), the noise after DAR is 0.206 LSB RMS, a negligible increase. This test was repeated with 2 g, 2.0 m/s, and 8 ms jerk with similar results, and with no change to DAR correction coefficients, which were determined to be: $R_v$=12 $\tau$ and $R_a$=6050 $\tau^2$, with $\tau$=100 ns equal to the sampling period $\Delta T$=100 ns. FIG. 7 shows a set of two graphs showing the velocity DAR compensation (upper graph) and acceleration DAR compensation (lower graph) separately from one another (i.e., Rv·V$_n$ and Ra·A$_n$, respectively).

Other embodiments will be understood by disclosed by persons of skill in this art.
Digital Implementations The features of the data processing described herein are generally implemented using FPGA and/or application-specific integrated circuits ("ASIC") architectures well known in the art. In further embodiments, they may also be implemented, at least in part, in digital electronic circuitry (including FPGA and/or ASIC architectures), or in computer hardware, firmware, or in combinations of these. For example, the features can be implemented in a computer program product tangibly embodied in an information carrier, e.g., in a machine-readable storage device, for execution by a programmable processor; and features can be performed by a programmable processor executing a program of instructions to perform functions of the described implementations by operating on input data and generating output. The described features can be implemented in one or more computer programs that are executable on a programmable system including at least one programmable processor coupled to receive data and instructions from, and to transmit data and instructions to, a data storage system, at least one input device, and at least one output device. A computer program includes a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, or one or more of multiple processors of any kind of computer. Generally, a processor will receive instructions and data from a read-only memory or a random access memory or both. Computers include a processor for executing instructions and one or more memories for storing instructions and data. Generally, a computer will also include, or be operatively coupled to communicate with, one or more mass storage devices for storing data files; such devices include magnetic disks, such as internal hard disks and removable disks; solid-state disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits). The features can implemented in a single process or distributed among multiple processors at one or many locations. For example, the features can employ cloud technology for data transfer, storage, and/or analysis.
Scope It must be noted that as used herein and in the appended claims, the singular forms "a", "an", and "the" include plural referents unless the context clearly dictates otherwise, e.g., when the word "single" is used.

As used herein, the terms "adapted" and "configured" mean that the element, component or other subject matter is designed and/or intended to perform a given function. Thus, the use of the terms "adapted" and "configured" should not be construed to mean that a given element, component, or other subject matter is simply "capable of" performing a given function.

As used herein, the phrases "at least one of" and "one or more of," in reference to a list of more than one entity, means any one or more of the entity in the list of entity, and is not limited to at least one of each and every entity specifically listed within the list of entity. For example, "at least one of A and B" (or, equivalently, "at least one of A or B," or, equivalently, "at least one of A and/or B") may refer to A alone, B alone, or the combination of A and B.

As used herein, the term "and/or" placed between a first entity and a second entity means one of (1) the first entity, (2) the second entity, and (3) the first entity and the second entity. Multiple entity listed with "and/or" should be construed in the same manner, i.e., "one or more" of the entity so conjoined. Other entity may optionally be present other than the entity specifically identified by the "and/or" clause, whether related or unrelated to those entities specifically identified.

While this specification contains many specific implementation details, these should not be construed as limitations on the scope of any inventions or of what may be claimed, but rather as descriptions of features specific to particular embodiments of particular inventions.

Certain features that are described in this specification in the context of separate embodiments can also be implemented in combination in a single embodiment.

Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of embodiments of the invention have been described. Nevertheless, it will be understood that various modifications may be made without departing from the spirit and scope of the invention. Accordingly, other embodiments are within the scope of the following claims.

What is claimed is:

1. A method comprising:
a. electronically extracting a sequence of values from a measurement signal corresponding to a position of a moving object, wherein the sequence of values indicates the position of the moving object at corresponding time increments;
b. electronically determining at least one of an estimate for a velocity of the moving object and an estimate for an acceleration of the moving the object based on a plurality of the values in the sequence of values; and
c. electronically correcting a subsequent value in the sequence of values based on one or both of the velocity and acceleration estimates,
  i. wherein the velocity estimate is electronically determined and used to correct the subsequent value in the sequence of values to correct for a position error caused by a data age delay,
  ii. wherein electronically extracting the sequence of values from the measurement signal comprises electronically extracting phase values from a frequency of interest in the measurement signal and unwrapping the phase values to produce the sequence of values corresponding to the position of the moving object, and
  iii. wherein the method further comprises repeating the electronic determining and the electronic correcting to provide a sequence of corrected values indicating the position of the moving object at corresponding time increments that is corrected for position errors caused by data age delay in the electronic extraction of the sequence of values and/or acceleration-dependent electronic filtering errors, and applying an action to the moving object based on the sequence of corrected values.

2. The method of claim 1, wherein the data age delay includes data age delay caused by the electronic extraction of the sequence of values.

3. The method of claim 1, wherein the data age delay is greater than 100 ns.

4. The method of claim 1, wherein the acceleration estimate is electronically determined and used to correct the subsequent value in the sequence of values.

5. The method of claim 4, wherein the method further comprises electronically filtering the sequence of values to reduce noise using a digital filter.

6. The method of claim 5, wherein the acceleration estimate is used to correct a position error in the subsequent value caused by an acceleration-dependent error from the electronic filtering.

7. The method of claim 5, wherein the electronic filtering comprises an alpha-beta filter.

8. The method of claim 5, wherein the electronic filtering is implemented after the electronic correction of the subsequent value.

9. The method of claim 5, wherein the electronic filtering is implemented before the electronic correction of the subsequent value.

10. The method of claim 1, wherein both of the velocity estimate and the acceleration estimate are electronically determined and used to adjust the subsequent value in the sequence of values to reduce a position error caused by a data age delay in the electronic extraction of the sequence of values and/or a position error caused by acceleration-dependent electronic filtering errors.

11. The method of claim 1, wherein action comprises directing an energy beam to a certain location of the object.

12. The method of claim 11, wherein the object is supported by a moving stage and a measurement system is optically coupled to the moving stage to generate the measurement signal.

13. The method of claim 12, wherein the measurement system comprises an interferometry system.

14. The method of claim 12, wherein the interferometry system comprises an encoder system.

15. The method of claim 1, wherein the time increments are in the range of 10 ns to 1 μs.

16. The method of claim 15, wherein the time increments are in the range of 25 ns to 100 ns.

17. The method of claim 1, wherein the absolute velocity of the object exceeds 0.001 m/s during at least a portion of the time corresponding to the sequence of values and is less than 100 m/s during all of the time corresponding to the sequence of values.

18. The method of claim 17, wherein the absolute velocity of the object exceeds 0.001 m/s during at least a portion of the time corresponding to the sequence of values and is less than 10 m/s during all of the time corresponding to the sequence of values.

19. The method of claim 1, wherein the absolute acceleration of the object exceeds 1 m/s$^2$ during at least a portion of the time corresponding to the sequence of values and is less than 100 m/s$^2$ during all of the time corresponding to the sequence of values.

20. The method of claim 1, wherein electronically determining at least one of an estimate for a velocity of the moving object and an estimate for an acceleration of the moving the object based on a plurality of the values in the sequence of values comprises electronically applying one or more differencing operations to the plurality of values.

21. The method of claim 20, wherein the velocity estimate $V_n$ for the n$^{th}$ time increment is determined according to:

$$V_n = \frac{P_n - P_{n-dnv}}{dnv}$$

where $P_n$ is the value in the sequence of values indicating position at time increment n and dnv is a positive integer.

22. The method of claim 21, wherein the acceleration estimate $A_n$ for the n$^{th}$ time increment is determined according to:

$$A_n = \frac{V_n - V_{n-dna}}{dna}$$

where dna is a positive integer.

23. The method of claim 22, where in dnv=dna.

24. The method of claim 22, wherein the corrected position value Pdar$_n$ in the sequence of values indicating position at time increment n is determined according to:

$$Pdar_n = P_n + Rv \cdot V_n + Ra \cdot A_n$$

wherein $P_n$ is the value in the sequence of values indicating position at time increment n, wherein $V_n$ and $A_n$ are the velocity and acceleration estimates at time increment n, respectively, and wherein Rv and Ra are constants.

25. The method of claim 24, further comprising determining the constants Rv and Ra in simulation or with hardware-generated internal test signals.

26. A$_n$ apparatus comprising an electronic processing module implementing one or more processors and configured to:

a. electronically extract a sequence of values from a measurement signal corresponding to a position of a moving object, wherein the sequence of values indicates the position of the moving object at corresponding time increments;

b. electronically determine at least one of an estimate for a velocity of the moving object and an estimate for an acceleration of the moving the object based on a plurality of the values in the sequence of values; and c. electronically correct a subsequent value in the sequence of values based on one or both of the velocity and acceleration estimates, i. wherein the velocity estimate is electronically determined and used to correct the subsequent value in the sequence of values to correct for a position error caused by a data age delay, ii. wherein electronically extracting the sequence of values from the measurement signal comprises electronically extracting phase values from a frequency of interest in the measurement signal and unwrapping the phase values to produce the sequence of values corresponding to the position of the moving object, wherein the apparatus further comprises a source for directing an energy beam to a certain location of the object based on the sequence of corrected values provided by the electronic processing module, a movable stage to support the movable object, and a stage controller for moving the stage, and wherein the electronic processing module is coupled to stage controller.

27. The apparatus of claim 26, wherein the electronic processing module implementing one or more processors is configured to electronically determine and use the acceleration estimate to correct the subsequent value in the sequence of values.

28. The apparatus of claim 27, wherein the electronic processing module further comprises a digital filter configured to electronically filter the sequence of values to reduce noise.

29. The apparatus of claim 28, wherein the electronic processing module implementing one or more processors is configured to use the acceleration estimate to correct a position error in the subsequent value caused by an acceleration-dependent error from the electronic filtering.

30. The apparatus of claim 26, wherein the electronic processing module implementing one or more processors is configured to electronically determine and use both of the velocity estimate and the acceleration estimate to adjust the subsequent value in the sequence of values to reduce a position error caused by a data age delay in the electronic extraction of the sequence of values and/or a position error caused by acceleration-dependent electronic filtering errors.

31. The apparatus of claim 26, wherein the electronic processing module implementing one or more processors is configured to repeat the electronic determining and the electronic correcting to provide a sequence of corrected values indicating the position of the moving object at corresponding time increments that is corrected for position errors caused by data age delay in the electronic extraction of the sequence of values and/or acceleration-dependent electronic filtering errors.

32. The apparatus of claim 26, further comprising an analog-to-digital converter for use in processing the measurement signal.

33. The apparatus of claim 32, further comprising a phase meter for use in processing the measurement signal.

34. The apparatus of claim 33, further comprising a glitch filter for use in processing the measurement signal.

\* \* \* \* \*